United States Patent [19]

Benveniste

[11] Patent Number: 5,026,997
[45] Date of Patent: Jun. 25, 1991

[54] ELLIPTICAL ION BEAM DISTRIBUTION METHOD AND APPARATUS

[75] Inventor: Victor M. Benveniste, Magnolia, Mass.

[73] Assignee: Eaton Corporation, Cleveland, Ohio

[21] Appl. No.: 436,296

[22] Filed: Nov. 13, 1989

[51] Int. Cl.$^5$ .......................................... H01J 37/317
[52] U.S. Cl. ............................ 250/492.2; 250/492.3;
250/423 R; 250/427; 315/111.81; 313/230;
313/363.1
[58] Field of Search ........... 250/492.21, 492.2, 423 R,
250/427, 492.3; 315/111.81; 313/230, 363.1

[56] References Cited

U.S. PATENT DOCUMENTS 2,700,107  1/1955  Luce ..................................... 313/230
4,831,270  5/1989  Weisenberger .................. 250/492.2

FOREIGN PATENT DOCUMENTS 61-91921  5/1986  Japan ................................. 250/492.3

Primary Examiner—Jack I. Berman
Attorney, Agent, or Firm—Watts, Hoffmann, Fisher & Heinke Co.

[57] ABSTRACT

An ion source for creating an ion beam. The source includes an ionization chamber having one wall that defines a generally elliptical opening for allowing ions to exit the ionization chamber. Use of an elliptical (in section) ion beam has advantages over a rectangular ion beam which allow the integrity of a relatively high current ion beam to be maintained as ions travel to a beam treatment workstation. A dual configuration extraction electrode assembly also provides for a range of extraction energies from a single source.

7 Claims, 4 Drawing Sheets

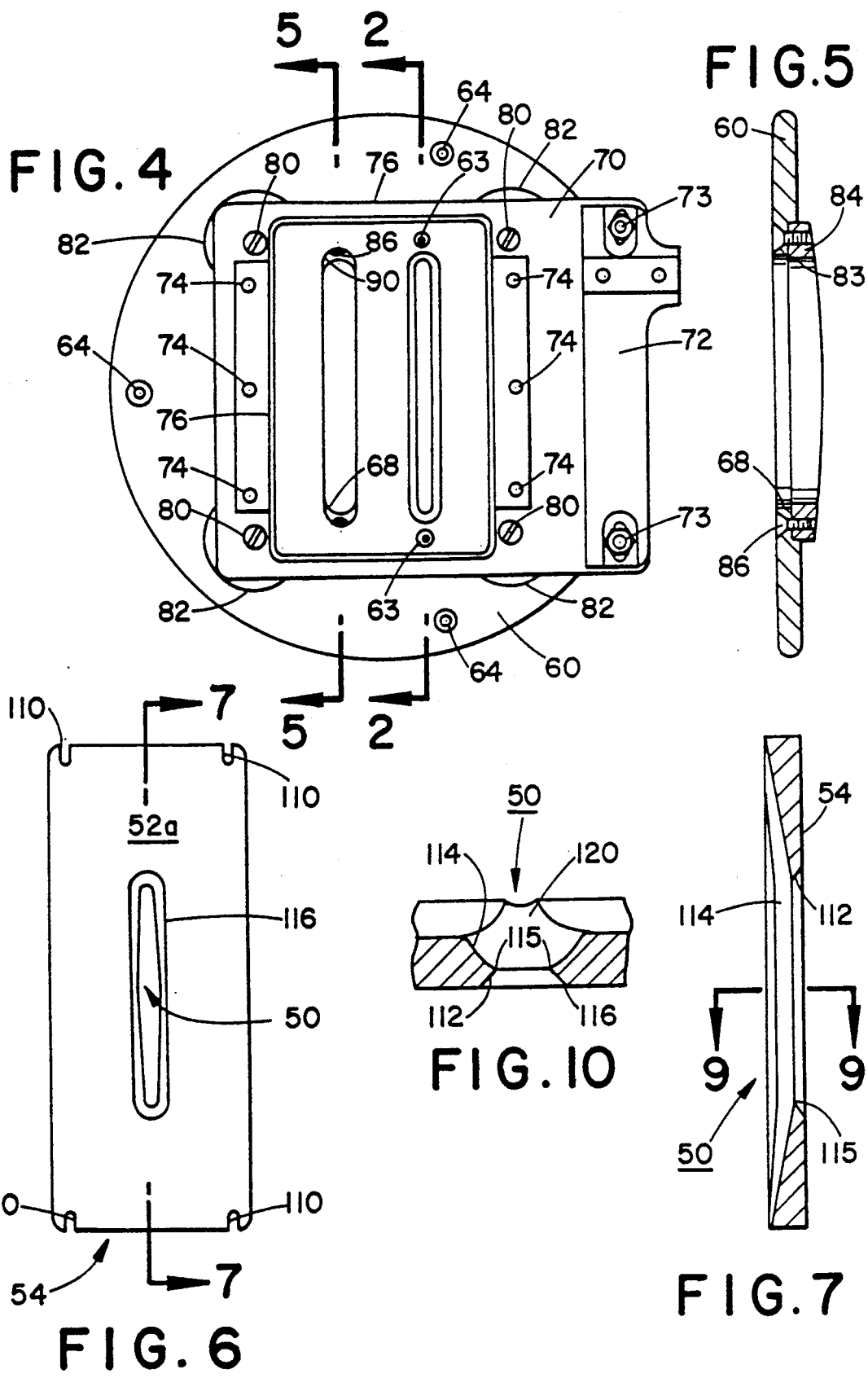

ELLIPTICAL ION BEAM DISTRIBUTION METHOD AND APPARATUS

FIELD OF THE INVENTION

The present invention concerns an ion source to provide an ion beam for treatment of a workpiece and more particularly to an ion source suitable for ion doping of substrates to form a semiconductor material.

BACKGROUND ART

In the process of doping semiconductor wafers, a common technique is to move the wafers relative to a fixed ion beam along a controlled path so that the ion beam density impacting the wafers is uniform and can be controlled by modifying the trajectory of the wafers in its movement relative the ion beam.

The components of an ion implanter include an ion source, acceleration apparatus for accelerating ions emitted by the source to a desired energy level, and analysis means such as a mass analyzer for diverting from the ion beam all but a well specified mass of ions used for ion beam treatment of a workpiece such as the semiconductor wafer.

In order to effectively transport the ion beam through drift spaces and conventional optics elements, the intensity distribution within the ion beam should be close to uniform.

One technique that has been commonly used to help control the shape of the ion beam in its travel path to the silicon wafer is a space charge neutralization technique wherein negatively charged particles are injected into the ion beam at a controlled density to neutralize the space charge of the beam. This process tends to reduce space charge induced repulsion which causes the ion beam to become more diffuse as ions within the beam move along their travel paths to the impact location.

In the prior art, typical techniques for maintaining control over the ion beam cross section have also included beam focusing devices which deflect ions within the ion beam in efforts to maintain control over the ion beam along the beam trajectory. All such efforts have involved use of beam modelling based upon theoretical effects expected due to space charge repulsion of a particular configuration ion beam. More specifically, prior art techniques are known and have been utilized for shaping ion beams having rectangular and circular cross sections since diffusion processes from these shape ion beams have been theoretically modelled.

Theoretical modelling of the charge distribution and uniformity of an ion beam charged configuration assumes that no electric field gradient exists in the long dimension of a rectangular beam. Uniform beam density in a rectangular beam results in an electric field gradient distribution having sharp discontinuities at the edges of the beam. This is an impossible situation to maintain over long ion beam trajectories. This raises the question of what beam distribution and resultant space charge gradient is in fact experienced by a rectangular beam and also raises the question of what countering steps in the form of ion beam focusing can be implemented on a rectangular beam.

The sharp nonuniformities in electrical gradient distribution experienced with a rectangular beam are not encountered with a circular beam. The current density experiences a uniform fall off as the radius to the center of the beam increases. This makes the ion beam modelling quite simple but results in low current and thus less effective ion implantation.

DISCLOSURE OF THE INVENTION

The present invention concerns method and apparatus for an ion beam source to provide an ion beam that can be better maintained since it does not produce sharp discontinuities in electric field gradient experienced in a rectangular beam system.

An ion implantation system constructed in accordance with the present invention directs a beam of ions along a travel path to impact a workpiece. The system has an ion source that includes an ion confinement chamber having an elongated slot for an exit aperture that conforms generally to the shape of an ellipse. Ions exiting the ion confinement chamber thus form a generally elliptically shaped ion beam.

A mass analyzer intercepts the ion beam exiting the source and causes ions of the proper mass to follow an impact trajectory to a workpiece implantation station. Structure defining the workpiece implantation station positions one or more workpieces for ion beam treatment by ions following the ion impact trajectory.

The use of an elliptical shaped aperture in the ion source allows the ion beam definition to be more easily maintained along the length of the ion beam without undue sacrifice in ion current. Since the ion beam can be more easily maintained, the structure along the beam path can be simpler and less costly. It is also possible to increase the physical separation between the ion source and the workpiece treatment station.

An extraction electrode assembly located closely adjacent the ion source has multiple sets of electrodes accelerating ions away from the source. Depending on desired extraction energy one or the other of the multiple sets is positioned to accelerate ions to the specified extraction energy prior to reaching the mass analyzer.

Details of one embodiment of the invention are described in conjunction with the accompanying drawings.

BRIEF DESCRIPTION OF THE DRAWINGS

FIG. 4 is a plan view of an extraction electrode for accelerating ions exiting the ion beam source;

FIG. 5 is a view from the plane defined by the line 5—5 in FIG. 4;

FIG. 6 is a plan view of an aperture defining plate as seen from the inside of the ion source;

FIG. 7 is a section view of the aperture plate as seen from the plane defined by the line 7—7 in FIG. 6;

FIG. 10 is an enlarged view of the section view of FIG. 9.

BEST MODE FOR PRACTICING THE INVENTION

Figure 1:
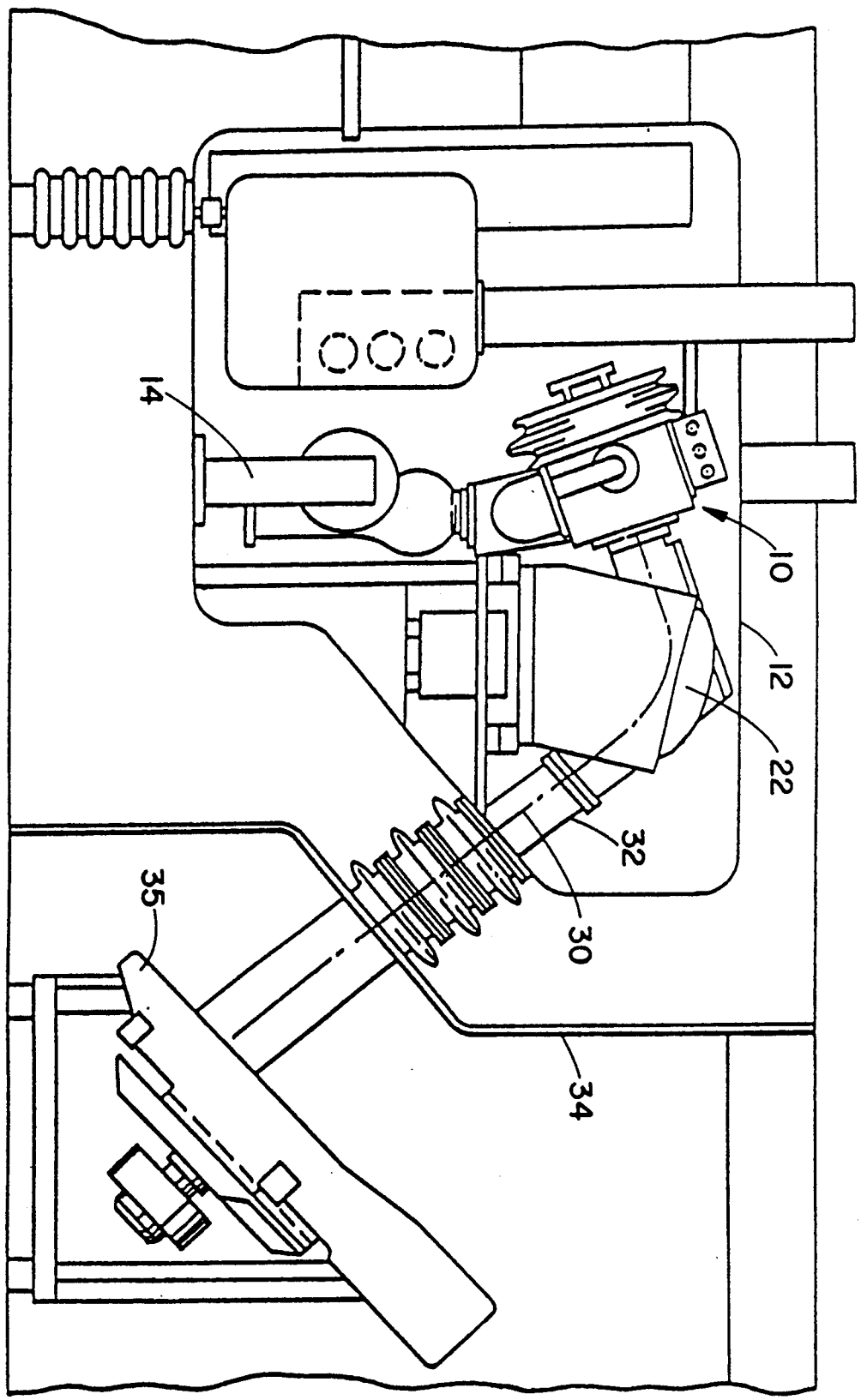
FIG. 1 is a system diagram of an ion implantation system particularly suited for ion beam treatment of silicon wafers.

The Figures depict a presently preferred design of an ion source 10 that produces an ion beam suitable for treating workpieces such as silicon wafers. The ion source 10 is shown positioned in a grounded evacuated chamber 12 and mounted to an adjustable support 14. The particular source 10 depicted in FIG. 1 is of the type where an ionizable gas is introduced into a chamber 16 (FIG. 3) and a filament 18 supported within the chamber is energized to cause energetic electrons to be emitted into the chamber and collide with the gas molecules to produce ions.

Figure 2:
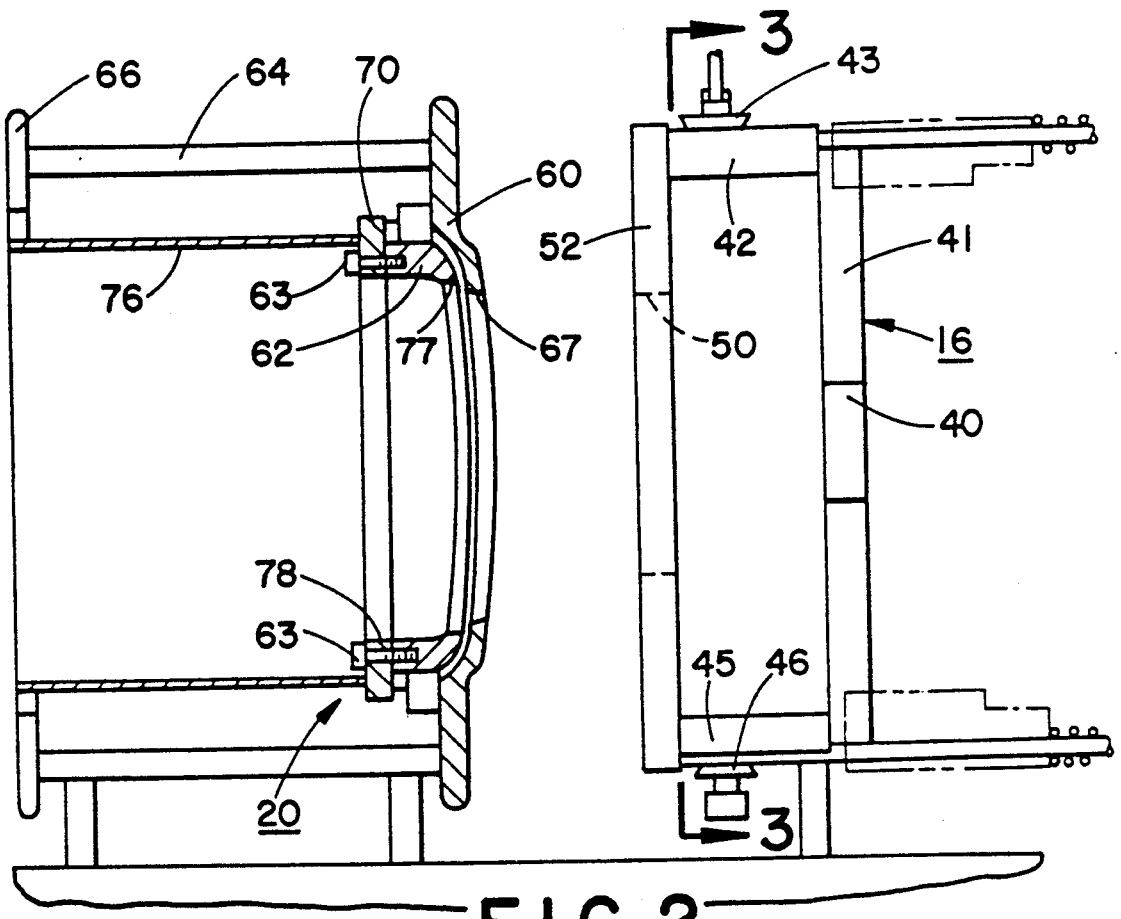
FIG. 2 is a side view of an ion beam source and an extraction electrode structure for providing an elliptically shaped ion beam.

Ions exit the ion source 10 under the influence of an electric field produced by an extraction electrode assembly 20 (FIG. 2). This electric field accelerates the ions along an initial trajectory leading to an analyzing magnet 22. The analyzing magnet 22 resolves the ion beam by deflecting ions in a manner that is dependant on the mass of the ions. The ions exiting the source that have a mass other than a specified ion mass are resolved from the ion beam. Ions of the appropriate mass exit the resolving magnet and are then accelerated along a generally linear path 30 by an additional electrode structure 32.

Ions that have been accelerated to an desired implantation energy enter a second evacuated chamber 34 that houses a wafer support 35 for moving a number of silicon wafers along controlled travel paths that intercept the ions. This dopes the silicon wafers to give them semiconductor characteristics, allowing them to be used in the fabrication of integrated circuits and the like. Additional details concerning the wafer treatment workstation are discussed in issued U.S. Pat. No. 4,419,584 to Benveniste which issued Dec. 6, 1983, and is incorporated herein by reference.

Figure 3:
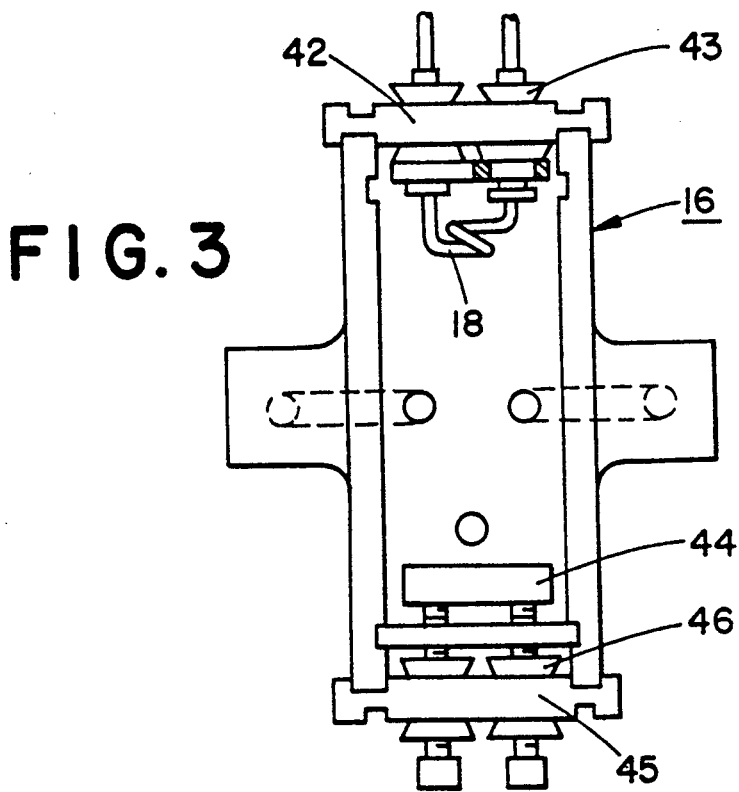
FIG. 3 is a view from the plane defined by the line 3—3 in FIG. 2.
Figure 8:
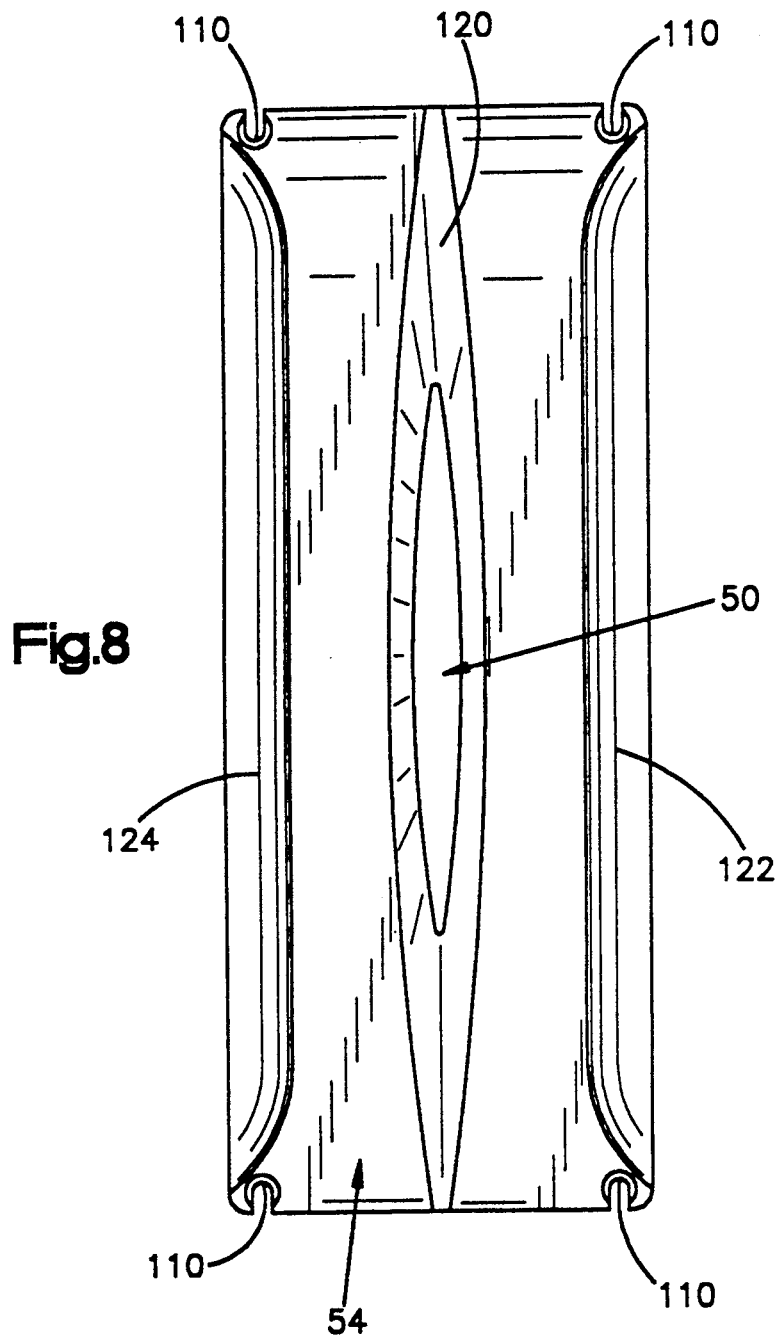
FIG. 8 is a plan view of the aperture plate showing an outwardly facing surface of that plate.
Figure 9:
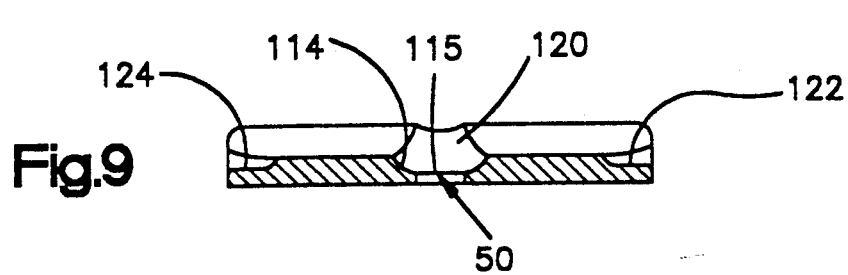
FIG. 9 is a view as seen from the plane defined by the line 9—9 in FIG. 7.

The ion source 10 is depicted in greater detail in FIGS. 2 and 3. The ion chamber 16 defines a rectilinear shaped volume and is biased to a potential of from 5 kv to 80 kv depending upon the desired ion beam energy. The chamber 16 is bounded by generally planar, inwardly facing walls that confine a desired concentration of an ionizable gas within the chamber. This gas is delivered to the chamber interior through an opening 40 in a rear wall 41 via a conduit coupled to a source of the gas (not shown).

The filament 18 (FIG. 3) is formed from a single loop of wire and is supported by an end wall 42 having two openings to accommodate the filament. Insulators 43 electrically isolate the end wall 42 from the electrical bias applied to the filament 18. As the filament 18 is energized by an external source at a voltage of approximately −100 v, highly energetic electrons are emitted, move through the chamber, and collide with gas molecules within the chamber 16. Those electrons not encountering gas molecules are repelled back into the center of the chamber 16 by a repeller plate 44 maintained at a negative potential (approximately −105 volts) and spaced from a supporting chamber wall 45 by an insulator 46. As ionization takes place the concentration of ions within the chamber increases and some of those ions exit the chamber through an elliptically shaped aperture or opening 50 in a front wall 52.

The aperture defining front wall 52 is spaced from and oriented generally parallel to the rear wall 42. The wall 52 is formed from a separately machined metal aperture plate 54 (FIG. 6) that can be detached from the chamber 16. This allows different configuration exit apertures to be used with a single ion chamber as well as facilitating periodic maintenance of the source.

As seen in the partially sectioned view of FIG. 2, the extraction electrode assembly 20 includes two field defining extraction electrodes 60,62 (FIG. 2) positioned relative to the aperture 50 in the aperture plate 42. The electrode 60 electrically biased at −2 kv and ground to create electric fields that accelerate ions that reach the aperture 50.

A first of the electrodes 60 located closest to the aperture 50 is generally circular and is supported by three connecting rods 64 that couple the electrode 60 to a support member 66. The electrode 60 defines two elongated slots 67, 68 (FIGS. 2 and 5) that are oriented generally parallel to each other. The electrode assembly 20 is positioned such that one or the other of the two slots 67, 68 allows ions exiting from the chamber 16 through the opening 50 to accelerate through the electrode 60.

The section view of FIG. 2 shows a second outer electrode 62, spaced from the inner electrode 60 near the slot 67 and maintained at ground potential. As seen most clearly in FIGS. 2 and 4 a rectangular shaped support member 70 fixes the second electrode 62 by means of connectors 63 that extend through the support 70 to engage the electrode 62. The support 70 is in turn coupled to a bracket 72 by means of connectors 73. By loosening the connectors 73 and moving the support 70 up and down relative to the bracket 72 the position of the plate 62 relative to the plate 60 can be adjusted.

Also attached to the support 70 by means of suitable threaded connectors 74 is a metallic shield 76 which is rectangular in plan and extends along the ion beam trajectory. Once the ion beam passes through the elongated slot 67 in the aperture plate 60 it passes through openings 77, 78 in the electrode 62 and support 70 and traverses the distance bounded by the shield 76.

Connectors 80 extend into and through the support 70 to engage electronically non-conductive spacers 82 that are fixed between the electrode 60 and the support 70. Similar connectors (not shown) extend through the electrode plate 60 to engage these spacers 82.

The electrode assembly 20 provides different ion extraction energizes by means of a second extraction electrode arrangement. By shifting the support 70 to the side, the second elongated slot 68 (FIG. 5) in the plate 60 is positioned to allow ions exiting the aperture 50 to pass through the electrode 60. When so positioned ions also pass through a slot 83 in a metal plate 84 attached to the plate 60 by threaded connectors 86. The support 70 defines an elongated slot 90 through which the ions then pass.

Details of the aperture plate 54 and opening 50 are seen in FIGS. 6-10. The plate 54 is metal and is fabricated by machining a cast plate. The plate 54 has slots 110 at its four corners to allow the plate 54 to be attached to (and detached from) the ion chamber 16.

The ion exit opening 50 is elongated and of a generally elliptical shape. The major diameter (length) of the opening is approximately 2.00 inches and the minor diameter (width) is approximately 0.157 inches. The plate is machined to a reduced thickness from its outer edges inward to the region of the opening 50. The sides of the opening 50 are beveled to form sloped surfaces 112,114 (FIG. 10) which meet along an elliptical edge 115 that defines the opening 50.

As seen in the plan view of the plate 54 facing the interior of the chamber (FIG. 6) the bevelled surface 112 slopes away from the opening 50 and meets a generally planar wall surface 52a along an oval shaped transition line 116. As seen most clearly in FIGS. 7, 8 and 10 the sloped surface 114 on the outwardly facing surface of the plate 54 forms a trough 120 that runs longitudinally along the length of the plate 54.

Elongated notches 122, 124 run along either edge of this side of the plate 54. For low energy ion extraction the electrode assembly 20 is moved in close proximity to the chamber 16. As seen in FIGS. 2 and 5 the electrode 60 (or plate 84 attached to the electrode 60) is slightly convex at the region ions pass through the electrode. The notches 122, 124 allow the electrode pattern not in use to be brought close to the aperture plate 54 without touching the plate 54. The trough 120 allows the electrode portion that is in use to be brought to a position in close proximity to the chamber 16.

The shape of the trough 120 and sloped surface 112 help establish the electric field at the region of the aperture 50 for accelerating ions away from the source to and through the electrode assembly 20.

While a preferred embodiment of the invention has been described with a degree of particularity it is the intent that the invention include all modifications and alterations from the disclosed design falling within the spirit or scope of the appended claims.

I claim:

1. An ion implantation system for directing a beam of ions along a travel path to impact a workpiece comprising an ion source having structure that defines an ion confinement chamber including a wall that tapers from a first thickness around an outer periphery of said wall inward from both sides of the wall toward a region bounding an ion exit aperture for allowing ions to exit from the ion confinement chamber and form an ion beam; an electron source mounted within the ion chamber for providing energetic electrons to collide with gas molecules within the ion confinement chamber and ionize those molecules; beam extraction means for accelerating ions within the beam away from the ion source; mass analyzer means for intercepting the ion beam and causing ions of the proper mass to follow an impact trajectory to the workpiece; and structure defining a workpiece implantation station for positioning one or more workpieces for ion beam treatment by ions following the impact trajectory;

said exit aperture characterized by an elongated slot having a maximum width near its center and which narrows from the maximum width toward curved ends.

2. The ion implantation system of claim 1 wherein the extraction means comprises an extraction electrode assembly positioned relative the ion source defining at least two differently configured sets of successive openings for accelerating ions exiting through the exit aperture and is adjustable to cause the ions to pass through a chosen one of said sets.

3. The ion implantation system of claim 1 wherein the maximum width of the exit aperture is less than 1/10 the length of the elongated slot.

4. The ion implantation system of claim 1 wherein an inwardly tapered section of the wall forming an exit side of said wall forms a trough that bounds the aperture and defines in part an electric field in the region of the aperture.

5. An ion implantation system for directing a beam of ions along a travel path to impact a workpiece comprising:

an ion source having structure that defines an ion confinement chamber including a wall member having a first thickness around its outer edge that tapers inward from both sides of the wall to a less thick region bounding an elliptically shaped aperture for allowing ions to exit from the ion confinement chamber to form a generally elliptically shaped ion beam;

an electron source mounted within the ion confinement chamber for providing energetic electrons to collide with gas molecules within the ion confinement chamber and ionize those molecules;

mass analyzer means for intercepting the generally elliptically shaped ion beam and causing ions of a proper mass to follow an impact trajectory to the workpiece;

structure defining a workpiece implantation station for positioning one or more workpieces for ion beam treatment by ions following the impact trajectory; and beam accelerating means for accelerating ions to a desired energy prior to the impact with the one or more workpieces at the workpiece implantation station.

6. A ion implantation system for directing a beam of ions along a travel path to impact a workpiece comprising:

an ion source having structure that defines an ion confinement chamber including a wall member having an elliptically shaped aperture for allowing ions to exit from the ion confinement chamber to form a generally elliptically shaped ion beam, the wall member having a first thickness that tapers to a thinner region inward from both sides of the wall member bounding the elliptically shaped aperture;

an electron source mounted within the ion confinement chamber for providing energetic electrons to collide with gas molecules within the ion confinement chamber and ionize those molecules;

mass analyzer means for intercepting the generally elliptically shaped ion beam and causing ions of a proper mass to follow an impact trajectory to the workpiece;

structure defining a workpiece implantation station for positioning one or more workpieces for ion beam treatment by ions following the impact trajectory; and beam accelerating means for accelerating ions to a desired energy prior to the impact with the one or more workpieces at the workpiece implantation station.

7. An ion implantation system for directing a beam of ions along a travel path to impact a workpiece comprising an ion source having structure that defines an ion confinement chamber including a wall that tapers from a first thickness around an outer periphery of said wall inward from both sides of the wall toward a region bounding an ion exit aperture for allowing ions to exit from the ion confinement chamber and form an ion beam; an electron source mounted within the ion chamber for providing energetic electrons to collide with gas molecules within the ion confinement chamber and ionize those molecules; beam extraction means for accelerating ions within the beam away from the ion source; the extraction means comprising an extraction electrode assembly positioned relative the ion source defining at least two differently configured sets of successive openings for accelerating ions exiting through the exit aperture and is adjustable to cause the ions to pass through a chosen one of said sets; mass analyzer means for intercepting the ion beam and causing ions of the proper mass to follow an impact trajectory to the workpiece; and structure defining a workpiece implantation station for positioning one or more workpieces for ion beam treatment by ions following the impact trajectory;

said exit aperture characterized by an elongated slot having a maximum width near its center which is less than 1/10 the length of the elongated slot and which narrows from the maximum width toward curved ends; wherein an inwardly tapered section of the wall forming an exit side of said wall forms a trough that bounds the aperture and defines in part an electric field in the region of the aperture.

* * * * *